United States Patent
Oh

(10) Patent No.: US 7,803,505 B2
(45) Date of Patent: Sep. 28, 2010

(54) METHOD OF FABRICATING A MASK FOR A SEMICONDUCTOR DEVICE

(75) Inventor: Sung Hyun Oh, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 328 days.

(21) Appl. No.: 11/950,313

(22) Filed: Dec. 4, 2007

(65) Prior Publication Data

US 2008/0280213 A1 Nov. 13, 2008

(30) Foreign Application Priority Data

May 11, 2007 (KR) .................. 10-2007-0045793

(51) Int. Cl.
*G03F 1/00* (2006.01)
(52) U.S. Cl. ..................... 430/5; 430/311; 430/394
(58) Field of Classification Search ............ 430/5, 430/311, 394
See application file for complete search history.

(56) References Cited

U.S. PATENT DOCUMENTS

| | | | |
|---|---|---|---|
| 2004/0131947 A1* | 7/2004 | Gallagher et al. | 430/5 |
| 2004/0224237 A1* | 11/2004 | Lin et al. | 430/5 |
| 2005/0247669 A1* | 11/2005 | Wang et al. | 216/59 |
| 2006/0093925 A1* | 5/2006 | Cheng | 430/5 |
| 2007/0166629 A1 | 7/2007 | Kanamitsu | |
| 2007/0248895 A1 | 10/2007 | Su | |

FOREIGN PATENT DOCUMENTS

| KR | 10-2000-0004744 A | 1/2000 |
|---|---|---|
| KR | 10-2004-0001276 A | 1/2004 |

* cited by examiner

*Primary Examiner*—Mark F Huff
*Assistant Examiner*—Rashid Alam
(74) *Attorney, Agent, or Firm*—Townsend and Townsend and Crew LLP

(57) ABSTRACT

In a method of fabricating a mask for a semiconductor device, a phase shift layer and a light blocking layer are formed on a transparent substrate. The light blocking layer is patterned to form light blocking patterns which partially expose a surface of the phase shift layer. An extension defect or a bridge defect is detected. A photoresist layer, which does not react to light, is formed on a resulting structure including the detected defect. The extension defect is removed by performing a repair process on the light blocking patterns. The bridge defect is removed by etching using the light blocking patterns as a mask.

11 Claims, 6 Drawing Sheets

METHOD OF FABRICATING A MASK FOR A SEMICONDUCTOR DEVICE

CROSS-REFERENCES TO RELATED APPLICATION

The priority of Korean application number 10-2007-0045793, filed on May 11, 2007, which is incorporated by reference in its entirety, is claimed.

BACKGROUND OF THE INVENTION

The invention relates to a semiconductor device and, more particularly, to a method of fabricating a mask for a semiconductor device capable of easily correcting a mask defect.

Several photolithography processes are performed to form patterns on a semiconductor substrate in a process of manufacturing a semiconductor device. The photolithography process requires a mask which has fine patterns to form the patterns on the substrate. However, when such a mask is fabricated, a defect sometimes occurs on the mask so that the mask is rejected.

A common reason for rejection of the mask is an occurrence of defects such as a bridge that causes adjacent patterns to be connected to each other in a process of forming the patterns on the mask. Another common reason for rejection of the mask is that a size of the patterns increases due to residue accumulation in the pattern. Usually, the defect is corrected by inspecting the mask after fabricating the mask and performing a repair process for a detected defect. The repair process is performed by irradiating a laser beam onto the mask defect.

However, during such a repair process, the laser beam may cause damage to a material formed on the mask so that a phase or transmittance of the patterns is adversely affected. Specifically, when a large number of defects exist on the mask such that the repair process becomes tedious, mask quality cannot be guaranteed after performing the repair process. Also, the yield of the semiconductor devices in the mask fabricating process cannot be improved because the repair process is time consuming.

Accordingly, a method for effectively correcting mask defects without requiring a time consuming repair process is desired.

SUMMARY OF THE INVENTION

In one embodiment of the invention, a method of fabricating a mask for a semiconductor device includes forming a phase shift layer and a light blocking layer on a transparent substrate. Light blocking patterns are formed which partially expose a surface of the phase shift layer by patterning the light blocking layer. An extension defect is detected. The extension defect is generated when the light blocking patterns are formed. A photoresist layer is formed on a resulting structure of the detected extension defect and the light blocking layer. The photoresist layer does not react to light. The light blocking patterns are exposed by a development process performed on the photoresist layer. The extension defect is removed by performing a repair process on the light blocking patterns. The photoresist layer is then removed.

The phase shift layer includes a molybdenum compound and the light blocking layer includes a chrome compound. The repair process removes the extension defect by irradiating a laser beam onto the defect.

In another embodiment of the invention, a method of fabricating a mask for a semiconductor device includes forming a phase shift layer and a light blocking layer on a transparent substrate. Light blocking patterns are formed which partially expose a surface of the phase shift layer by patterning the light blocking layer. Phase shift patterns are formed using the light blocking patterns. A bridge defect is detected. The bridge defect is generated when the phase shift patterns are formed. A photoresist layer is formed on a resulting structure of the detected bridge defect and the exposed layers. The photoresist layer does not react to light. The bridge defect is exposed by performing a development process on the photoresist layer. The exposed bridge defect is etched using the light blocking patterns and the phase shift patterns as a mask. The photoresist layer is then removed.

BRIEF DESCRIPTION OF THE DRAWINGS

The above and other objects, features and advantages of the invention will be more apparent from the following detailed description taken in conjunction with the accompanying drawings, in which.

DESCRIPTION OF SPECIFIC EMBODIMENTS

FIGS. 1 to 12 are cross-sectional views illustrating a method of fabricating a mask for a semiconductor device, according to an embodiment of the invention.

Figure 1:
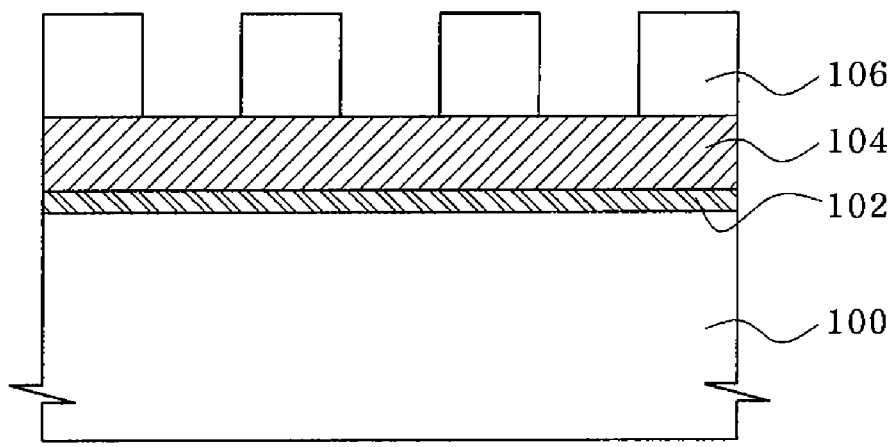
FIGS. 1 to 12 are cross-sectional views illustrating a method of fabricating a mask for a semiconductor device according to the present invention.

Referring to FIG. 1, a phase shift layer 102 and a light blocking layer 104 are deposited on a transparent substrate 100. The transparent substrate 100 is made of transparent material such as quartz. The phase shift layer 102 is made of a material that shifts a phase of light in a subsequent exposure process. In one embodiment, the phase shift layer 102 includes a molybdenum compound, for example, molybdenum silicon nitride (MoSiON). The light blocking layer 104 may be a chrome (Cr) film. Photoresist patterns 106 that form a mask pattern area are formed on the light blocking layer 104 by depositing and patterning a photoresist material.

Figure 2:
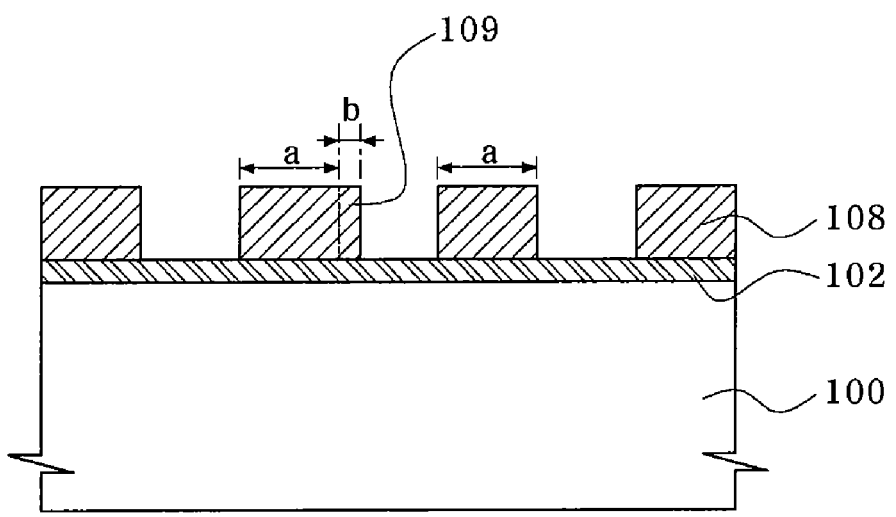

Referring to FIG. 2, light blocking patterns 108 are formed by etching the light blocking layer 104 using the photoresist patterns 106 as a mask. The light blocking patterns 108 partially expose a surface of the phase shift layer 102. Thereafter, the photoresist patterns 106 are removed using a strip process.

During the process of forming the light blocking patterns 108, an extension defect 109, in which a pattern size is unexpectedly extended as much as a distance "b," may occur. The extension defect 109 affects a subsequent etching process of the phase shift layer 102 so that it becomes difficult to form an accurate pattern. Therefore, a process may be required to remove the extension defect 109.

Figure 3:
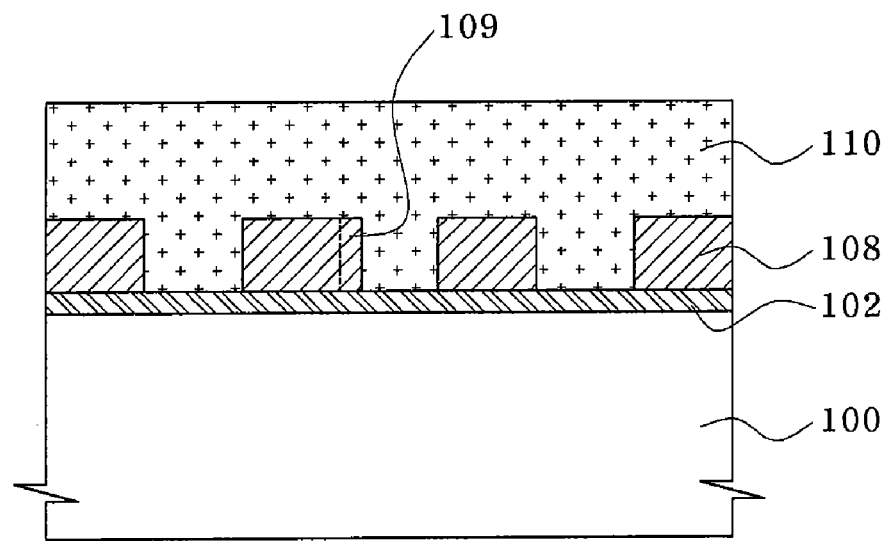

Referring to FIG. 3, a first photoresist layer 110 is deposited on the exposed phase shift layer 102 and the light blocking patterns 108. The first photoresist layer 110 does not include a photoacid generator.

The photoresist layer is made of a photosensitive material used in an exposure process. The photoresist layer exhibits properties which change in response to a specific wavelength of light. Specifically, the photoresist material has a high molecular composition of which a chemical structure change happens rapidly due to light irradiation so that property changes occur in the solubility for any solvent, as well as property changes in coloring and hardening. Usually, the photoresist material includes a photoacid generator, a resin, a solvent and an additive. The photoacid generator generates an acid when receiving light. This acid is activated during a post-exposure baking process and operates as a catalyst for a reaction of separating a dissolution inhibitor from the resin. The resin to which the dissolution inhibitor adheres does not dissolve in a developing solution in a subsequent development process. The resin which does not include the dissolution inhibitor dissolves well. Thus, an unexposed area remains as a photoresist pattern. The solvent is used for a dissolution effect and for improved coating. The solvent also improves uniformity when coating the photoresist material. The additive is used for improved leveling, adhesion and storage stability.

When the photoacid generator is not included in the photoresist material, the first photoresist layer 110 does not react to light during an exposure process. Furthermore, the first photoresist layer 110 that does not include the photoacid generator has a constant dissolution rate for a developing solution in a subsequent development process.

Figure 4:
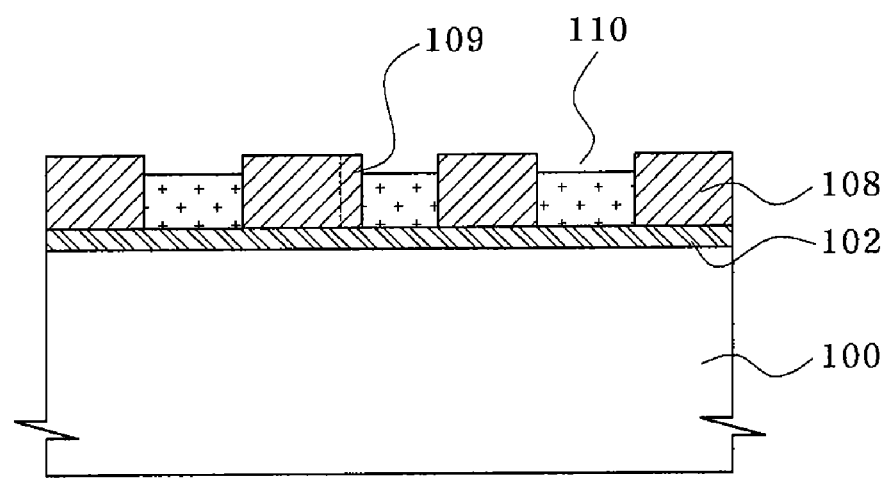

Referring to FIG. 4, a development process is performed on the first photoresist layer 110 without light exposure, thereby exposing surfaces of the light blocking patterns 108. The first photoresist layer 110 dissolves in a developing solution at a constant dissolution rate. The development process is performed until the surfaces of the light blocking patterns 108 are exposed.

Figure 5:
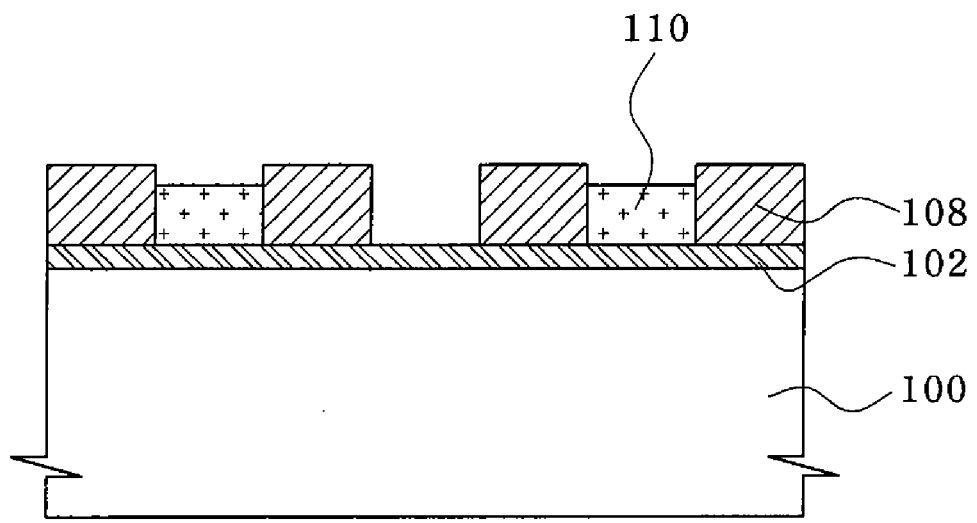

Referring to FIG. 5, a defect inspection is performed on the transparent substrate 100 and the extension defect 109 generated in the light blocking pattern 108 is detected. A repair process for removing the detected extension defect 109 is then performed. The extension defect 109 can be removed by irradiating a laser beam onto the defect. Since the first photoresist layer 110 covers the phase shift layer 102 exposed between the light blocking patterns 108, the first photoresist layer 110 operates as a protective layer to prevent the phase shift layer 102 and the transparent substrate 100 from being damaged during the repair process.

In the conventional method, the repair process is conducted for a detected defect after forming a mask and performing a defect inspection on the mask. In such a case, damage may occur on a pattern formed on the mask during the repair process. Damage occurring on the pattern adversely affects a phase or transmittance of the pattern. Therefore, in one embodiment of the present invention, a defect inspection and a repair process are performed after the light blocking patterns 108 and the first photoresist layer 110 are formed. The first photoresist layer 110 prevents the phase shift layer 102 and the transparent substrate 100 from being damaged during the repair process.

Figure 6:
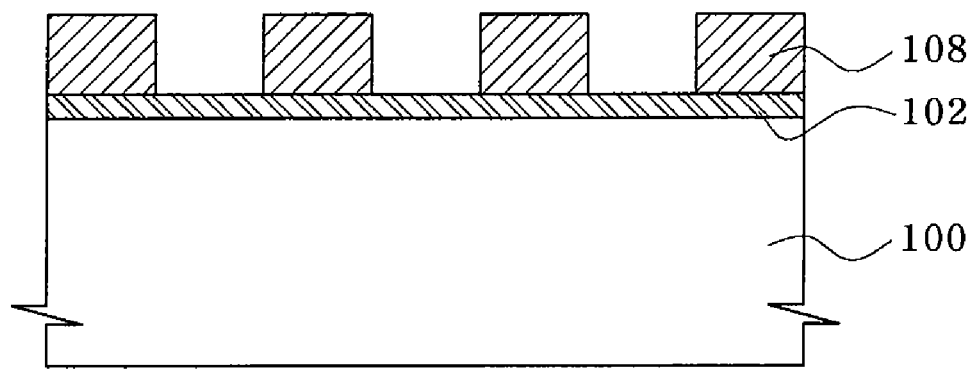

Referring to FIG. 6, a strip process is performed on the transparent substrate 100 to remove the first photoresist layer 110. Subsequently, a cleaning process for removing residue and eliminating contamination is performed. Thus, a surface of the phase shift layer 102 is exposed.

Figure 7:
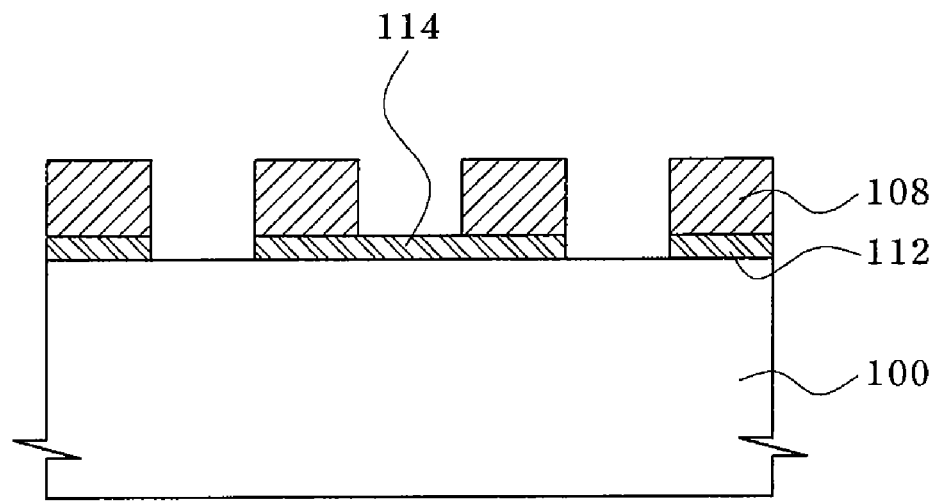

Referring to FIG. 7, a first etching is performed using the light blocking patterns 108 as a mask to form phase shift patterns 112. However, during the process of forming the phase shift patterns 112, a bridge defect 114 may occur. The bridge defect 114 results from an improper etching of the phase shift layer so that adjacent patterns are connected to each other. The bridge defect 114 can be removed by a repair process. However, when a large number of defects exist on a mask, the repair process becomes tedious and mask quality cannot be guaranteed. Also, if the repair process becomes overly time consuming, the yield of the semiconductor devices in the mask fabricating process cannot be improved. Accordingly, a process is required to remove the bridge defect 114 without performing a repair process.

Figure 8:
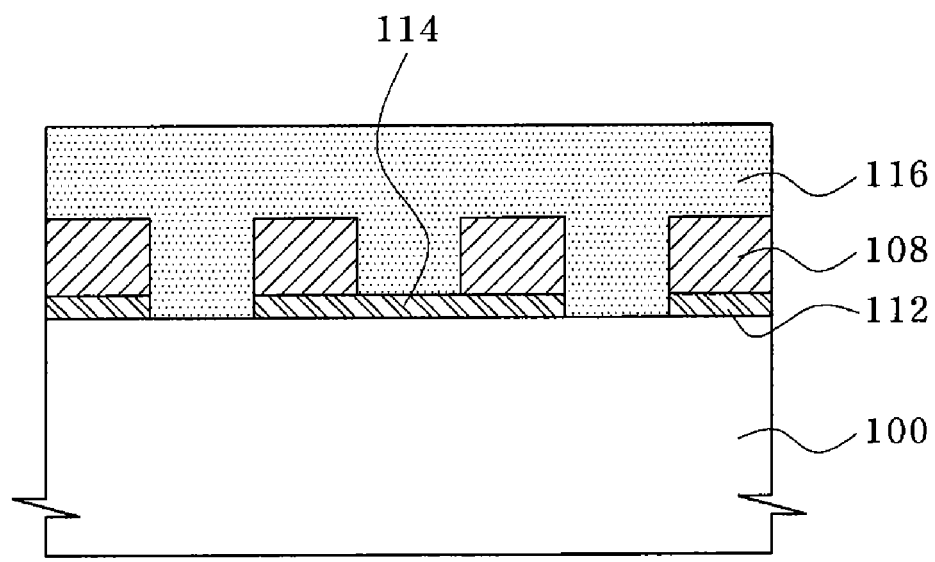

Referring to FIG. 8, a second photoresist layer 116 is coated on the light blocking patterns 108, the phase shift patterns 112 and the transparent substrate 100. The second photoresist layer 116 does not include a photoacid generator. As described above, the photoacid generator is a catalyst for a reaction with light. Thus, the second photoresist layer 116 does not react to light in an exposure process and has a constant dissolution rate for a developing solution in a subsequent development process.

Figure 9:
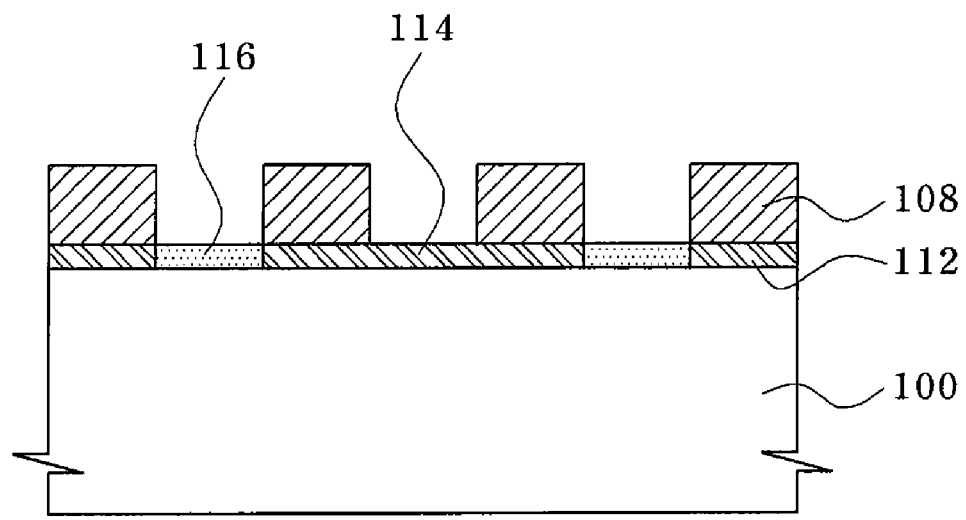

Referring to FIG. 9, a development process is performed on the second photoresist layer 116 without light exposure. The second photoresist layer 116 dissolves in a developing solution at a constant dissolution rate. In one embodiment, the development process is performed until the bridge defect 114 is exposed.

Figure 10:
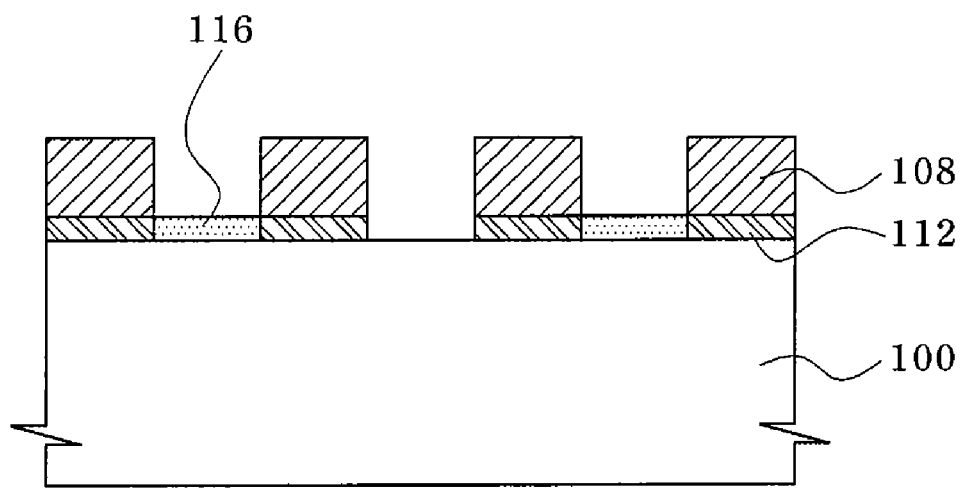

Referring to FIG. 10, a second etching using the light blocking patterns 108 as an etching mask is performed to form the phase shift patterns 112. Since the second photoresist layer 116 covers the transparent substrate 100, the transparent substrate 100 is prevented from being damaged during the etching process. Although many bridge defects 114 may be formed on the mask, all of the bridge defects may be removed by the second etching process using the second photoresist layer 116 as a mask. Thus, a repair process need not be performed.

Figure 11:
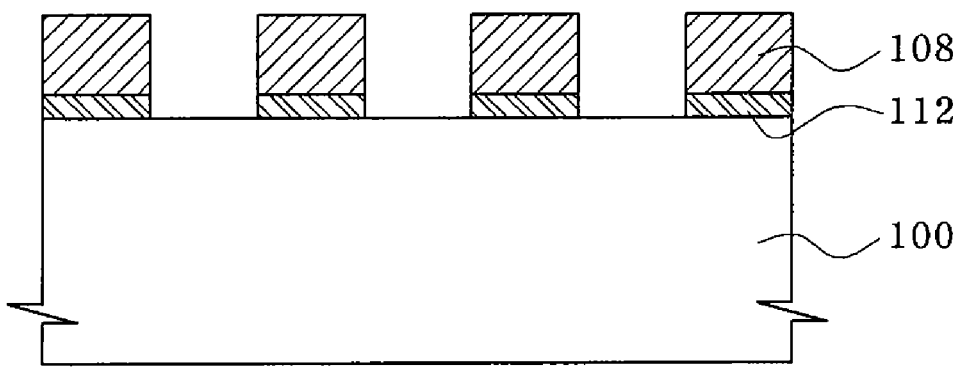

Referring to FIG. 11, a strip process is performed on the transparent substrate 100 so that the second photoresist layer 116 is removed. Subsequently, a cleaning process for removing residue and eliminating contamination is performed. Thus, a surface of the transparent substrate 100 is partially exposed.

Figure 12:
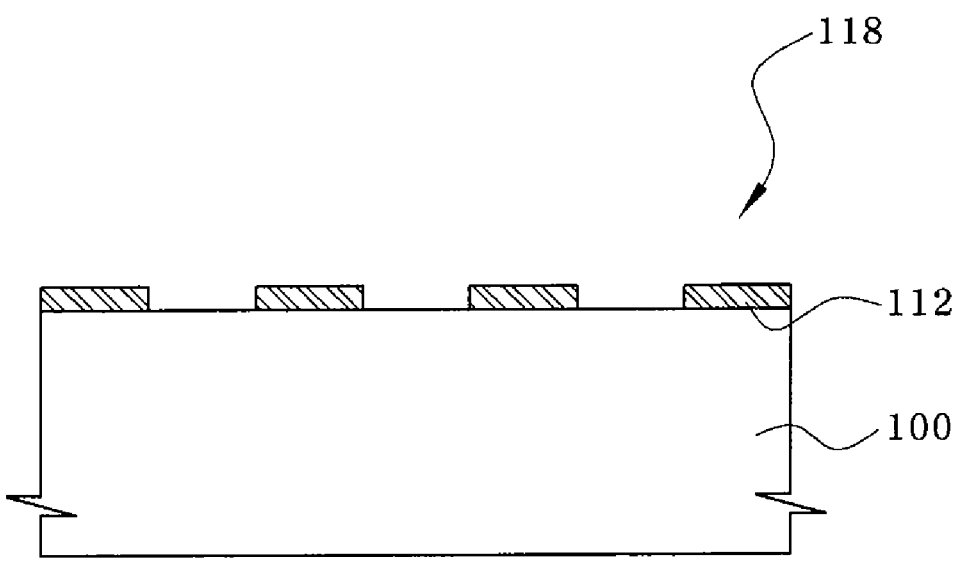

Referring to FIG. 12, a mask 118 is formed by removing the light blocking patterns 108.

The method of fabricating a mask for a semiconductor device according to the present invention includes coating a photoresist layer on a mask and developing the photoresist layer for a constant time period without an exposure process when an extension defect or a bridge defect occurs during a process of fabricating the mask. Accordingly, lower layers can be protected in a repair process for removing the extension defect and the bridge defect can be effectively corrected without performing a repair process.

While the present invention has been described with respect to particular embodiments, it will be apparent to those skilled in the art that various changes and modifications may be made without departing from the spirit and scope of the invention as defined in the following claims.

What is claimed is:

1. A method of fabricating a mask for a semiconductor device, the method comprising:

forming a phase shift layer and a light blocking layer over a transparent substrate;

forming light blocking patterns by patterning the light blocking layer, wherein the light blocking patterns partially expose a surface of the phase shift layer;

detecting an extension defect generated when the light blocking patterns are formed;

preparing a resist layer, wherein the resist layer is a photoresist layer without a photoacid generator;

depositing the resist layer over the detected extension defect and the light blocking patterns;

performing a development process over the resist layer to expose a surface of the light blocking patterns by providing a developing solution without exposing process;

removing the extension defect by performing a repair process on the light blocking patterns, wherein the resist layer covers the phase shift layer through the repair process; and removing the resist layer.

2. The method according to claim 1, wherein the phase shift layer includes a molybdenum compound.

3. The method according to claim 1, wherein the light blocking layer includes a chrome compound.

4. The method according to claim 1, wherein removing the extension defect comprises irradiating a laser beam onto the extension defect.

5. The method according to claim 1, wherein the transparent substrate includes quartz.

6. The method according to claim 1, wherein the resist layer dissolves in the developing solution at a constant dissolution rate during the development process.

7. A method of fabricating a mask for a semiconductor device, the method comprising:

forming a phase shift layer and a light blocking layer over a transparent substrate;

forming light blocking patterns by patterning the light blocking layer, wherein the light blocking patterns partially expose a surface of the phase shift layer;

forming phase shift patterns using the light blocking patterns as an etch mask;

detecting a bridge defect generated when the phase shift patterns are formed;

preparing a resist layer, wherein the resist layer is a photoresist layer without a photoacid generator;

depositing the resist layer over the detected bridge defect and the exposed layers;

performing a development process over the resist layer to expose a surface of the bridge defect by providing a developing solution without exposing process;

etching the exposed bridge defect using the light blocking patterns as a mask, wherein the resist layer covers the surface of the transparent substrate through etching the exposed bridge defect; and removing the resist layer.

8. The method according to claim 7, wherein the phase shift layer includes a molybdenum compound.

9. The method according to claim 7, wherein the light blocking layer includes a chrome compound.

10. The method according to claim 7, wherein the transparent substrate includes quartz.

11. The method according to claim 7, wherein the resist layer dissolves in the developing solution at a constant dissolution rate during the development process.

* * * * *